(12) United States Patent
Zhang

(10) Patent No.: US 9,846,344 B2
(45) Date of Patent: Dec. 19, 2017

(54) DISPLAY PANEL, DISPLAY DEVICE, DISPLAY PANEL MANUFACTURING METHOD AND DISPLAY METHOD

(71) Applicants: BOE TECHNOLOGY GROUP CO., LTD., Beijing (CN); BEIJING BOE DISPLAY TECHNOLOGY CO., LTD., Beijing (CN)

(72) Inventor: Chunbing Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 447 days.

(21) Appl. No.: 14/379,507

(22) PCT Filed: Sep. 24, 2013

(86) PCT No.: PCT/CN2013/084078
§ 371 (c)(1),
(2) Date: Aug. 19, 2014

(87) PCT Pub. No.: WO2015/010363
PCT Pub. Date: Jan. 29, 2015

(65) Prior Publication Data
US 2016/0238917 A1 Aug. 18, 2016

(30) Foreign Application Priority Data

Jul. 22, 2013 (CN) .......................... 2013 1 0308908

(51) Int. Cl.
*G02F 1/1333* (2006.01)
*G02F 1/167* (2006.01)
(Continued)

(52) U.S. Cl.
CPC ............ *G02F 1/167* (2013.01); *G02F 1/1347* (2013.01); *H01L 27/3232* (2013.01);
(Continued)

(58) Field of Classification Search
CPC ................... G02F 1/167; G02F 1/1347; G02F 2001/1676; G02F 2001/133342;
(Continued)

(56) References Cited

U.S. PATENT DOCUMENTS 7,733,325 B2 * 6/2010 Hamaguchi ....... G02F 1/134363
345/107
2007/0222922 A1 * 9/2007 Jin ........................ C23C 14/027
349/110
(Continued)

FOREIGN PATENT DOCUMENTS

CN 201066422 * 5/2008 ............. G02F 1/167
CN 201066422 Y 5/2008

OTHER PUBLICATIONS

PCT International Preliminary Report on Patentability for PCT/CN2013/084078, dated Jan. 26, 2016; 7 pgs.

*Primary Examiner* — Stephone B Allen
*Assistant Examiner* — Rahman Abdur

(57) ABSTRACT

A display panel includes a display layer and two electrophoresis layers; the display layer is located between the two electrophoresis layers; the display layer has two display surfaces; each of the two electrophoresis layers comprises a plurality of electrophoresis units, and states of the electrophoresis units include transparent state and non-transparent state. The display panel can implement single-side display, two-side display and completely-transparent display and has a simple structure, thereby leading to a reduced thickness.

16 Claims, 4 Drawing Sheets

(51) Int. Cl.
*G02F 1/1347* (2006.01)
*H01L 27/32* (2006.01)
*H01L 51/56* (2006.01)

(52) U.S. Cl.
CPC ...... *H01L 27/3246* (2013.01); *H01L 27/3267* (2013.01); *H01L 27/3283* (2013.01); *H01L 27/3286* (2013.01); *H01L 51/56* (2013.01); *G02F 2001/133342* (2013.01); *G02F 2001/1672* (2013.01); *G02F 2001/1676* (2013.01); *H01L 2227/323* (2013.01)

(58) Field of Classification Search
CPC ..... G02F 2001/1672; G02F 2001/1678; G02F 1/172; H01L 27/3232; H01L 51/56; G02B 26/026
USPC .......................................................... 359/296
See application file for complete search history.

(56) References Cited

U.S. PATENT DOCUMENTS

| | | | |
|---|---|---|---|
| 2011/0199671 A1* | 8/2011 | Amundson | G09G 3/344 |
| | | | 359/296 |
| 2011/0261293 A1* | 10/2011 | Kimura | G02F 1/13624 |
| | | | 349/74 |
| 2012/0182598 A1* | 7/2012 | Morisue | H01L 27/1214 |
| | | | 359/296 |
| 2012/0236391 A1* | 9/2012 | Miyamoto | G02F 1/167 |
| | | | 359/296 |

* cited by examiner

DISPLAY PANEL, DISPLAY DEVICE, DISPLAY PANEL MANUFACTURING METHOD AND DISPLAY METHOD

CROSS REFERENCE TO RELATED APPLICATIONS

This application is based on International Application No. PCT/CN2013/084078 filed on Sep. 24, 2013, which claims priority to Chinese National Application No. 201310308908.4 filed on Jul. 22, 2013. The entire contents of each and every foregoing application are incorporated herein by reference.

TECHNICAL FIELD

Embodiments of the present invention relate to a display panel, a display device, a display panel manufacturing method and a display method.

BACKGROUND

With the advancement of information transmission and development towards thin and light electronic products, demands for display panels are varying constantly. For example, information boards at public traffic hubs, and information display board at business hall windows require the display devices be able to display on both sides to facilitate users to obtain information. Some portable electronic products also require two-side display to extend picture space, switch quickly and process more jobs. At present, common two-side display devices in the industry are made by attaching two single-side display panels back-to-back, which causes high manufacturing expenses and in which each display panel has own driving systems respectively. That is, a traditional two-side display is implemented by simply combining two separate displays, which has a large volume, a big thickness and occupies large space.

SUMMARY

Embodiments of the present invention provide a display panel, a display device, a display panel manufacturing method and a display method that can avoid shortages of traditional two-side displays such as large volume, big thickness, separate driving systems, high manufacturing expenses and high process requirements.

One aspect of the present invention provides a display panel including a display layer and two electrophoresis layer; the display layer is located between the two electrophoresis layers; the display layer has two display surfaces; each of the two electrophoresis layers comprises a plurality of electrophoresis units, and states of the electrophoresis units include transparent state and non-transparent state.

For example, in the display panel, the display layer comprises an array comprising a plurality of pixel units, and the pixel units are in one-to-one correspondence to electrophoresis units of each of the two electrophoresis layers.

For example, in the display panel, the electrophoresis units comprise two transparent electrode layers disposed oppositely, and the transparent electrode layers are plane electrode layers or patterned electrode layers.

For example, in the display panel, the transparent electrode layers are parallel to the display layer or the transparent electrode layers are perpendicular to the display layer.

For example, in the display panel, in the case where the transparent electrode layers are perpendicular to the display layer, there is further one transparent electrode layer disposed perpendicularly to the two transparent electrode layers disposed oppositely between the two transparent electrode layers disposed oppositely.

For example, in the display panel, the electrophoresis units comprise liquid and black particles that move under an action of an electric field formed between the two transparent electrode layers disposed oppositely to switch the electrophoresis units between the transparent state and the non-transparent state.

For example, in the display panel, the electrophoresis units comprise micro-capsules, and the liquid and black particles are contained in the micro-capsules.

For example, in the display panel, the pixel units are organic light emitting diodes.

For example, in the display panel, the organic light emitting diode comprises an anode, an organic layer and a cathode formed on a base substrate; and the organic layer is between the anode and the cathode and the organic layer comprises a light emitting layer.

Another aspect of the present invention further provides a display device including the above-mentioned display panel.

Yet another aspect of the present invention further provides a manufacturing method of display panels, including: forming a display layer for two-side display on one side of a first substrate; forming a first electrophoresis layer between an other side of the first substrate and a second substrate, which comprising a plurality of electrophoresis units with a transparent state and a black state; disposing a third substrate on the display layer; forming a second electrophoresis layer between one side of the third substrate, which side is apart from the display layer, and a fourth substrate, the second electrophoresis layer comprising a plurality of electrophoresis units with a transparent state and a non-transparent state.

For example, in the manufacturing method, the first electrophoresis layer comprises a first transparent electrode layer and a second transparent electrode layer; and the first transparent electrode layer and the second transparent electrode layer are disposed on the first substrate and the second substrate respectively.

For example, in the manufacturing method, the second electrophoresis layer comprises a third transparent electrode layer and a fourth transparent electrode layer; and the third transparent electrode layer and the fourth transparent electrode layer are disposed on the third substrate and the fourth substrate respectively.

For example, in the manufacturing method, the first electrophoresis layer includes a first transparent electrode layer, a second transparent electrode layer and a third transparent electrode layer; and the first transparent electrode layer is disposed on the first substrate or the second substrate; the second transparent electrode layer and the third transparent electrode layer are disposed on two sides of the electrophoresis units respectively, the second transparent electrode layer and the third transparent electrode layer are perpendicular to the first substrate and second substrate respectively.

For example, in the manufacturing method, the second electrophoresis layer comprises a fourth transparent electrode layer, a fifth transparent electrode layer and a sixth transparent electrode layer; and the fourth transparent electrode layer is disposed on the third substrate or the fourth substrate; the fifth transparent electrode layer and the sixth transparent electrode layer are disposed on two sides of the electrophoresis units respectively, the fifth transparent electrode layer and the sixth transparent electrode layer are perpendicular to the third substrate and fourth substrate respectively.

For example, in the manufacturing method, micro-capsules are provided in the electrophoresis units and the micro-capsules comprise liquid and black charged particles.

For example, in the manufacturing method, liquid containing black particles is injected into the electrophoresis units, and the liquid containing black particles is disposed between the first substrate and the second substrate or between the third substrate and the fourth substrate.

For example, in the manufacturing method, forming a display layer for two-side display includes: forming an anode on the first substrate; forming a pixel defining layer for separating pixel areas; and forming a hole transport layer, a light emitting layer, an electron transport layer and a cathode in turn in the pixel areas separated by the pixel defining layer.

Yet another aspect of the present invention further provides a display method of a display panel, and the display panel applies the above-mentioned display panel, the method including: controlling states of electrophoresis units of the electrophoresis layer to implement single-side display or two-side display.

For example, in the display method, controlling states of electrophoresis units of the electrophoresis layer to implement single-side display comprises: controlling all the electrophoresis units in one electrophoresis layer to be transparent state; controlling all the electrophoresis units in an other electrophoresis layer to be non-transparent state.

For example, in the display method, the controlling states of electrophoresis units of the electrophoresis layer to implement two-side display comprises: controlling odd numbered rows of electrophoresis units of one electrophoresis layer to be transparent state and even numbered rows of electrophoresis units to be non-transparent state; controlling odd numbered rows of electrophoresis units of an other electrophoresis layer to be non-transparent state and even numbered rows of electrophoresis units to be transparent state; region-dependent display of the display layer in which odd numbered rows of pixel units of the display layer display one picture, while even numbered rows of pixel units of the display layer display another picture.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

Figure 1:
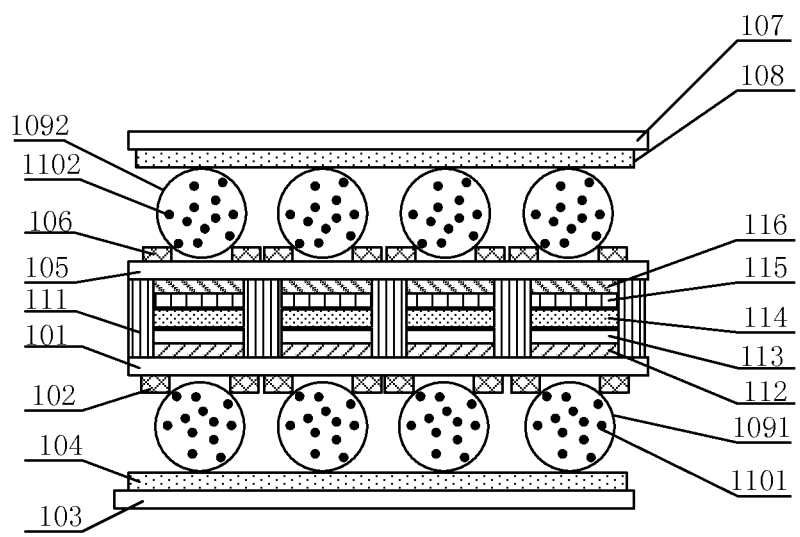
FIG. 1 is a structure diagram of a display panel provided in embodiment 1 of the present invention.

101—First substrate; 102—First transparent electrode layer; 103—Second substrate; 104—Second transparent electrode layer; 105—Third substrate; 106—Third transparent electrode layer; 107—Fourth substrate; 108—Fourth transparent electrode layer; 1091—Micro-capsule; 1092—Micro-capsule; 1101—Black particle; 1102—Black particle; 111—Pixel defining layer; 112—Anode; 113—Hole transport layer; 114—Light emitting layer; 115—Electron transport layer; 116—Cathode;

201—First substrate; 202—Second substrate; 203—Third substrate; 204—Fourth substrate; 205—First transparent electrode layer; 2061—Second transparent electrode layer; 2062—Third transparent electrode layer; 207—Fourth transparent electrode layer; 2081—Fifth transparent electrode layer; 2082—Sixth transparent electrode layer; 2091—Micro-capsule; 2092—Micro-capsule; 2101—Black particle; 2102—Black particle; 211—Pixel defining layer; 212—Anode; 213—Hole transport layer; 214—Light emitting layer; 215—Electron transport layer; 216—Cathode;

301—First substrate; 302—Second substrate; 303—Third substrate; 304—Fourth substrate; 305—First transparent electrode layer; 3061—Second transparent electrode layer; 3062—Third transparent electrode layer; 307—Fourth transparent electrode layer; 3081—Fifth transparent electrode layer; 3082—Sixth transparent electrode layer; 3091—Micro-capsule; 3092—Micro-capsule; 3101—Black particle; 3102—Black particle; 311—Pixel defining layer; 312—Anode; 313—Hole transport layer; 314—Light emitting layer; 315—Electron transport layer; 316—Cathode.

DETAIL DESCRIPTION

Specific implementations of the present invention will be further described in detail below with reference to accompanying drawings and embodiments. The following embodiments are used for explaining the present invention rather than limiting the scope of the present invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Similarly, terms such as "one", "a" or "the" do not mean to limit quantity but represent the presence of at least one. The terms "comprises," "comprising," "includes," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

Embodiments of the present invention provide a display panel, a display device, a display panel manufacturing method and a display method.

Embodiment 1

The present embodiment provides a display panel that includes a display layer and two electrophoresis layers.

The display layer is located between the two electrophoresis layers and has two display sides for displaying still images or motion images. The display layer includes an array comprising a plurality of pixel units, and the electrophoresis layers each include a plurality of electrophoresis units. States of the electrophoresis units include a transparent state and a black state (one example of non-transparent states). Pixel units in the display layer are in one-to-one correspondence to the electrophoresis units of each electrophoresis layer such that electrophoresis units of the two electrophoresis layers are also in one-to-one correspondence. The "one-to-one correspondence" refers to the case in which an electrophoresis unit in the black state can completely block light emitted from a corresponding pixel unit, or an electrophoresis unit in the transparent state can completely pass light emitted from a corresponding pixel unit to allow light exit through the electrophoresis layers.

FIG. 1 is a structure diagram of a display panel provided in embodiment 1 of the present invention. The pixel units are for example organic light emitting diodes (OLEDs). An organic light emitting diode includes an anode 112, an organic layer and a cathode 116 formed on a base substrate, and the organic layer is between the anode 112 and the cathode 116 and the organic layer includes a light emitting layer 114. For example, the organic layer may include a hole transport layer 113 formed on the anode 112, a light emitting layer 114 formed on the hole transport layer 113, and an electron transport layer 115 formed on the light emitting layer 114. In one example, the organic layer may further include other light emitting auxiliary layers such as an electron barrier layer and a hole barrier layer. Furthermore, the OLED may also include other auxiliary layers such as a light scattering layer, a light emitting enhancement layer.

The electrophoresis layer includes a plurality of electrophoresis units. The electrophoresis unit includes two transparent electrode layers disposed oppositely and electrophoresis units on the upper and bottom surfaces include microcapsules 1091 and micro-capsules 1092 respectively. The transparent electrode layers are planar electrode layers (such as plate electrodes) or patterned electrode layers (such as comb-like electrodes). The micro-capsule 1091 includes liquid and black particles 1101; the micro-capsule 1092 includes liquid and black particles 1102. Black particles in the micro-capsules are black charged particles capable of moving under the action of the electric field formed by the two transparent electrode layers disposed oppositely on two sides of the micro-capsule to realize the switch between the transparent state and the black state of the electrophoresis units. However, it is noted that charged particles in the micro-capsules are not limited to black charged particles, and they may also be charged particles of other colors such as white, red, etc. so long as they can realize a non-transparent state. Description will be given below with respect to black charged particles as an example.

States of the electrophoresis units include a transparent state and a black state. The transparent state refers to the state for realizing still image or motion image display by controlling black particles 1101 or black particles 1102 with an electric field formed by a voltage difference such that black particles 1101 or black particles 1102 are out of the way of light emitted from the light emitting layer 114 in the display layer. The black state refers to the state for realizing still image or motion image display by controlling black particles 1101 or black particles 1102 with an electric field formed by a voltage difference such that black particles 1101 or black particles 1102 block light emitted from the light emitting layer 114 in the display layer.

The display panel of the present embodiment can realize single-side display, two-side display or completely-transparent display, which is described specifically below.

1. Single-Side Display

S11: Allowing all the electrophoresis units in one electrophoresis layer into the transparent state.

A voltage is applied to the transparent electrode layer corresponding to all the electrophoresis units of one electrophoresis layer to drive the black particles in the microcapsules to approach the corresponding transparent electrode layer and the black particles are out of the way of light emitted from the light emitting layer. Now the electrophoresis units exhibit the transparent state, and the display effect of the display panel can be seen from one side corresponding to the display panel.

Taking the case where the display panel is made to realize upper-side display as an example, the corresponding operations are as follows:

The second transparent electrode layer 104 and the fourth transparent electrode layer 108 (the second transparent electrode layer 104 and the fourth transparent electrode layer 108 are plane electrode layers) are connected to a reference voltage. A voltage is applied to a third transparent electrode layer 106 corresponding to all the electrophoresis units in the upper electrophoresis layer (the third transparent electrode layer 106 is a patterned electrode layer) to drive the black particles 1102 in the micro-capsules 1092 to approach the corresponding third transparent electrode layer 106, and the black particles 1102 are out of the light emitted from the light emitting layer 114. Now the electrophoresis units exhibit the transparent state, and the display effect of the display panel may be seen from the corresponding upper side of the display panel. Applying different voltages to the third transparent electrode layer 106 can control the black particles to approach or move away from the third transparent electrode layer.

S12: Allowing all the electrophoresis units in the other electrophoresis layer into the black state.

A voltage is applied to the transparent electrode layer corresponding to all the electrophoresis units of the other electrophoresis layer to drive the black particles in the micro-capsules to move away from the corresponding transparent electrode layer, and the black particles block light emitted from the light emitting layer. Now the electrophoresis units exhibit the black state, and a display effect of the display panel cannot be seen from one corresponding side of the display panel. Corresponding operations are described below.

A voltage is applied to a first transparent electrode layer 102 corresponding to all the electrophoresis units in the bottom electrophoresis layer (the first transparent electrode layer 102 is a patterned electrode layer) to drive the black particles 1101 in the micro-capsules 1091 to move away from the corresponding first transparent electrode layer 102, and the black particles 1101 block light emitted from the light emitting layer 114. Now the electrophoresis units exhibit the black state, and the display effect of the display panel cannot be seen from the corresponding bottom side of the display panel. Applying different voltages to the first transparent electrode layer 102 can control the black particles to approach or move away from the first transparent electrode layer 102.

Figure 2:
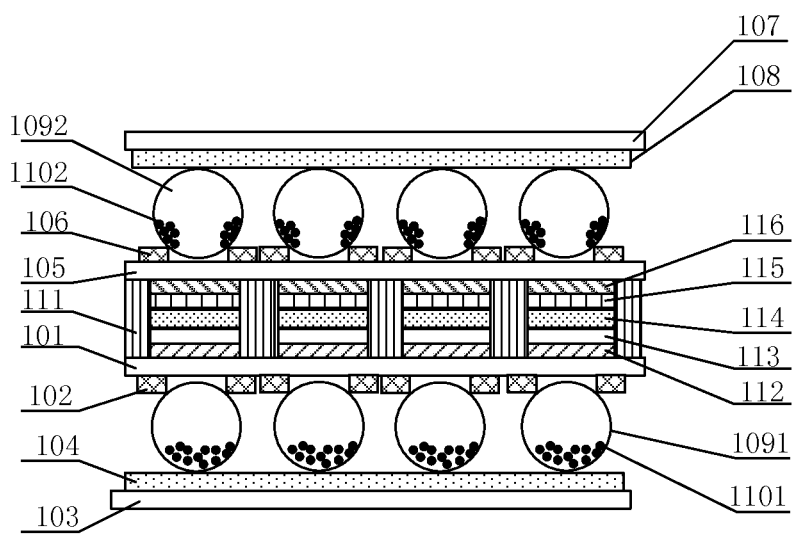
FIG. 2 is a schematic diagram of a display panel provided in embodiment 1 of the present invention which realizes single-side display.

A schematic diagram of realizing single-side display with a display method of the display panel provided in the present embodiment is illustrated in FIG. 2.

2. Two-Side Display

S21: Allowing odd numbered rows of electrophoresis units of one electrophoresis layer into the transparent state and even numbered rows of electrophoresis units into the black state.

A voltage is applied to a transparent electrode layer corresponding to odd numbered rows of (e.g., in a direction of from left to right) electrophoresis units in one electrophoresis layer to drive the black particles in the micro-capsules to approach the corresponding transparent electrode layer, and the black particles are out of the way of light emitted from the light emitting layer. Now the electrophoresis units of odd numbered rows exhibit the transparent state. And a voltage is applied to a transparent electrode layer corresponding to even numbered rows of (e.g., in a direction of from left to right) electrophoresis units in the electrophoresis layer to drive the black particles in the micro-capsules to move away from the corresponding transparent electrode layer, and the black particles block light emitted from the light emitting layer. Now the electrophoresis units of even numbered rows exhibit the black state.

For example, the second transparent electrode layer 104 and the fourth transparent electrode layer 108 are connected to a reference voltage. A voltage is applied to a third transparent electrode layer 106 corresponding to odd numbered rows of (e.g., in a direction of from left to right) electrophoresis units in the upper electrophoresis layer to drive black particles 1102 in the micro-capsules 1092 to approach the corresponding third transparent electrode layer 106 and the black particles 1102 are out of the way of light emitted from the light emitting layer 114. Now the electrophoresis units of odd numbered rows exhibit the transparent state. And a voltage is applied to the first transparent electrode layer 106 corresponding to even numbered rows of (e.g., in a direction of from left to right) electrophoresis units in the upper electrophoresis layer to drive black particles 1102 in the micro-capsules 1092 to move away from the corresponding third transparent electrode layer 106, and the black particles 1102 block light emitted from the light emitting layer 114. Now the electrophoresis units of even numbered rows exhibit the black state.

S22: Allowing odd numbered rows of electrophoresis units of the other electrophoresis layer into the black state and even numbered rows of electrophoresis units into the transparent state.

A voltage is applied to a transparent electrode layer corresponding to odd numbered rows of (e.g., in a direction of from left to right) electrophoresis units in the other electrophoresis layer to drive the black particles in the micro-capsules to move away from the corresponding transparent electrode layer and the black particles block light emitted from the light emitting layer. Now the electrophoresis units of odd numbered rows exhibit the black state. And a voltage is applied to a transparent electrode layer corresponding to even numbered rows of (e.g., in a direction of from left to right) electrophoresis units in the bottom electrophoresis layer to drive the black particles in the micro-capsules to approach the corresponding transparent electrode layer and the black particles are out of the way of light emitted from the light emitting layer. Now the electrophoresis units of even numbered rows exhibit the transparent state.

For example, a voltage is applied to a first transparent electrode layer 102 corresponding to odd numbered rows of (e.g., in a direction of from left to right) electrophoresis units in the bottom electrophoresis layer to drive the black particles 1101 in the micro-capsules 1091 to move away from the corresponding first transparent electrode layer 102, and the black particles 1101 block light emitted from the light emitting layer 114. Now the electrophoresis units of odd numbered rows exhibit the black state. And a voltage is applied to the first transparent electrode layer 102 corresponding to even numbered rows of (e.g., in a direction of from left to right) electrophoresis units in the electrophoresis layer to drive black particles 1101 in the micro-capsules 1091 to approach the corresponding first transparent electrode layer 102, and the black particles 1101 are out of the way of light emitted from the light emitting layer 114. Now the electrophoresis units of even numbered rows exhibit the transparent state.

S23: Display dependent on regions of the display layer, wherein odd numbered rows of pixel units of the display layer display one picture, while even numbered rows of pixel units of the display layer display another picture.

Pixel units in the display layer corresponding to the transparent state of electrophoresis units in step S21 display one picture, and pixel units in the display layer corresponding to the transparent state of electrophoresis units in step S22 display another picture. The two pictures of the display layer may display the same image or different images respectively.

Figure 3:
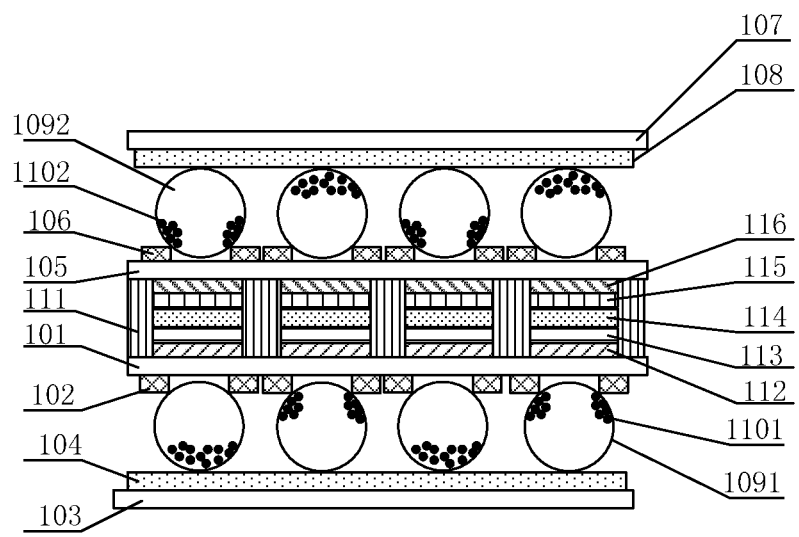
FIG. 3 is a schematic diagram of a display panel provided in embodiment 1 of the present invention which realizes two-side display.

A schematic diagram of realizing two-side display with a display method of the display panel provided in the present embodiment is illustrated in FIG. 3.

3. Completely-Transparent Display

In addition to the single-side display, the display panel of the present embodiment can also realize completely-transparent display in which both sides of the display panel display the same images but in opposite directions. Specific operations are as follows.

A voltage is applied to the first transparent electrode layer 102 to drive black particles 1101 in the micro-capsules 1091 to approach the first transparent electrode layer 102; and at the same time a voltage is applied to the third transparent electrode layer 106 to drive black particles 1102 in the micro-capsules 1092 to approach the third transparent electrode layer 106. Now all pixel units of the display layer display one picture, that is, one side of the display screen displays the front side image, while the other side of the display screen displays the back side image.

Figure 4:
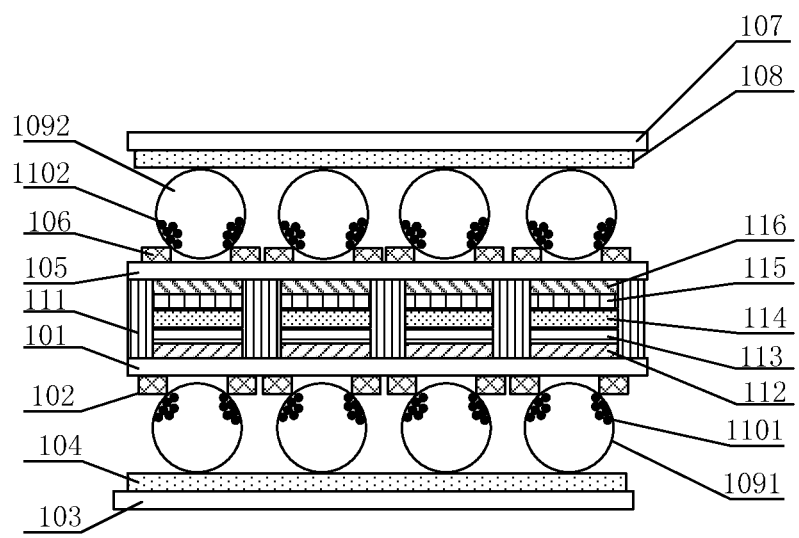
FIG. 4 is a schematic diagram of a display panel provided in embodiment 1 of the present invention which realizes completely-transparent display.

A schematic diagram of the completely-transparent display by the display panel provided in the present embodiment 1 is illustrated in FIG. 4.

Structures of the first transparent electrode layer 102, the second transparent electrode layer 104, the third transparent electrode layer 106 and the fourth transparent electrode layer 108 in the present embodiment are variable so long as they can realize the black state or the transparent state of micro-capsules 1091 or micro-capsules 1092.

Embodiment 2

Embodiment 1 relates to a case in which the transparent electrode layers are parallel to the display layer. In the present embodiment, modifications are made to the structure of the electrophoresis layers on the basis of embodiment 1. Consider the case in which the transparent electrode layers are perpendicular to the display layer.

When the transparent electrode layers are perpendicular to the display layer, there is further a transparent electrode layer disposed perpendicularly to the two transparent electrode layers disposed oppositely between these two transparent electrode layers disposed oppositely. In this structure, the disadvantage of low space utilization ratio of a ball structure can be avoided, and the effects of the transparent state and the black state will be better.

Two cases may be considered depending on the position of the transparent electrode layer perpendicular to the two transparent electrode layers disposed oppositely.

Figure 5:
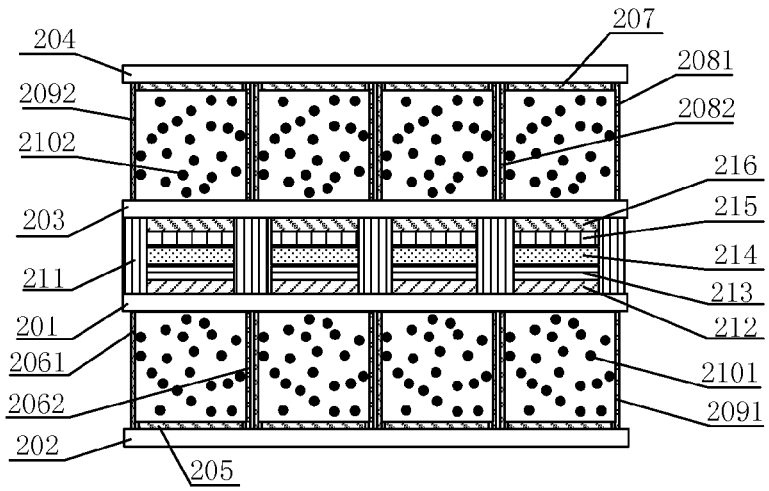
FIG. 5 is a structure diagram of a display panel provided in embodiment 2 of the present invention.
Figure 6:
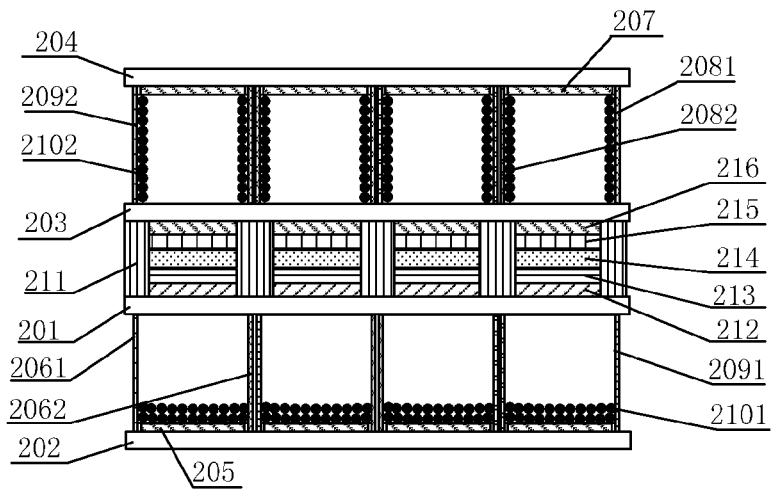
FIG. 6 is a schematic diagram of a display panel provided in embodiment 2 of the present invention which realizes single-side display.
Figure 7:
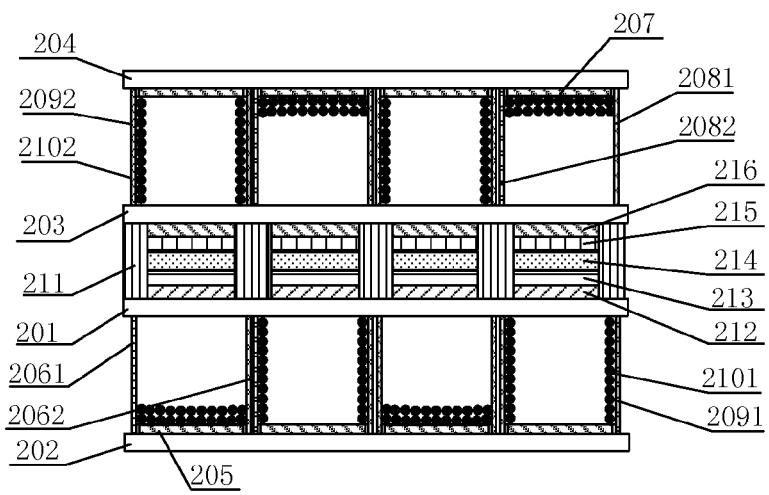
FIG. 7 is a schematic diagram of a display panel provided in embodiment 2 of the present invention which realizes two-side display.

1. When the first transparent electrode layer 205 and the fourth transparent electrode layer 207 are located on the second substrate 202 and the fourth substrate 204 respectively, the corresponding structure diagram, the schematic diagram of realizing single-side display and the schematic diagram of realizing two-side display are as illustrated in FIGS. 5, 6 and 7 respectively.

While implementing single-side display, for example, a voltage is applied to the first transparent electrode layer 205 while no voltage is applied to the second transparent electrode layer 2061 and the third transparent electrode layer 2062 to make the black particles 2101 completely cover the surface of the first transparent electrode layer 205, functioning to block the light emitting layer 214; and at the same time, no voltage is applied to the fourth transparent electrode layer 207, while a voltage is applied to the fifth transparent electrode layer 2081 and the sixth transparent electrode layer 2082 to make the black particles 2102 completely cover surfaces of the fifth transparent electrode layer 2081 and the sixth transparent electrode layer 2082, without blocking the light emitting layer 214.

While implementing two-side display, for example, a voltage is applied to the first transparent electrode layer 205, the second transparent electrode layer 2061, the third transparent electrode layer 2062, the fourth transparent electrode layer 207, the fifth transparent electrode layer 2081 and the sixth transparent electrode layer 2082 respectively to bring odd numbered rows and even numbered rows of pixels of the light emitting layer 214 into opposite transmission states, hence realizing two-side display.

While implementing completely-transparent display, a voltage is applied to the first transparent electrode layer 205, the second transparent electrode layer 2061, the third transparent electrode layer 2062, the fourth transparent electrode layer 207, the fifth transparent electrode layer 2081 and the sixth transparent electrode layer 2082 respectively to bring both upper and bottom electrophoresis layers into the transparent state.

Figure 8:
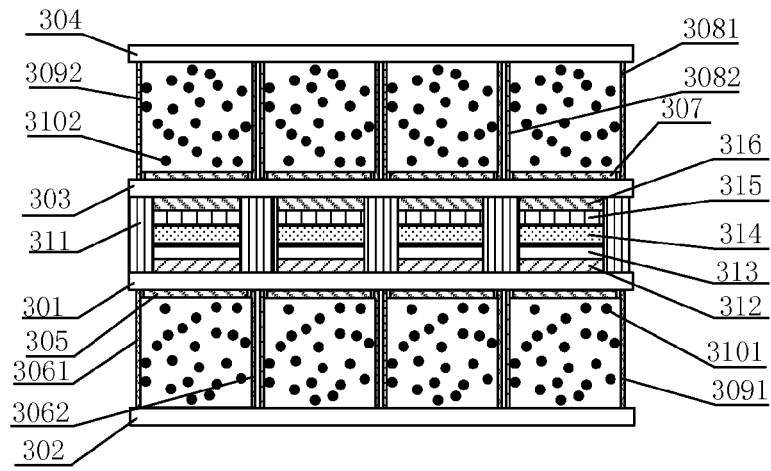
FIG. 8 is another structure diagram of a display panel provided in embodiment 2 of the present invention.
Figure 9:
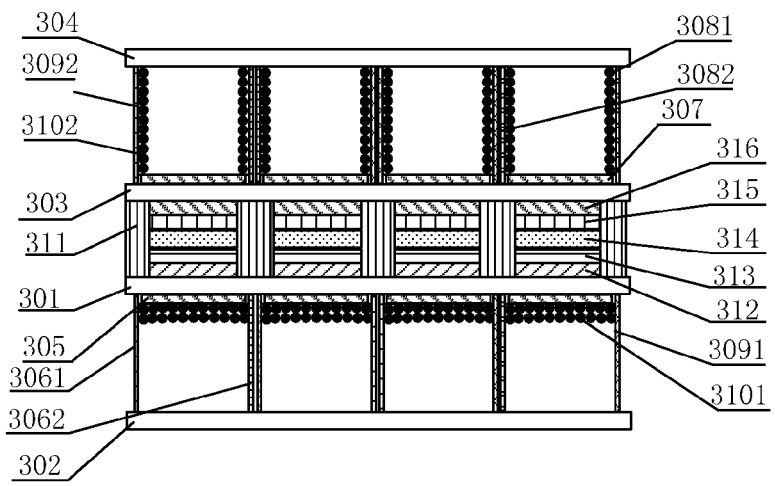
FIG. 9 is a schematic diagram of another structure of a display panel provided in embodiment 2 of the present invention which realizes single-side display.
Figure 10:
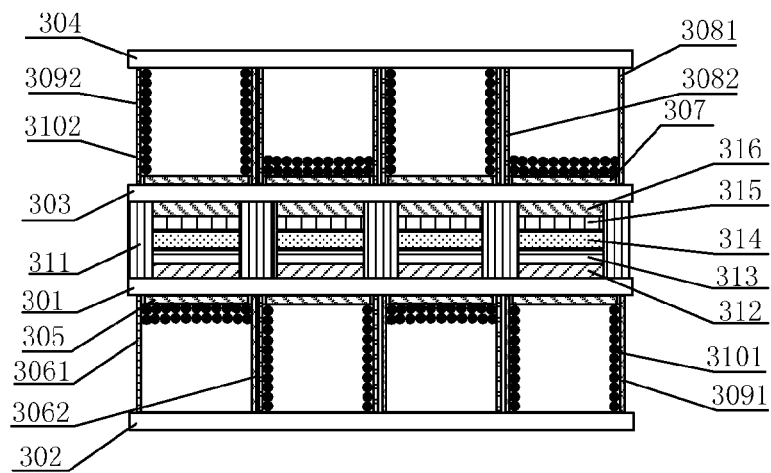
FIG. 10 is a schematic diagram of another structure of a display panel provided in embodiment 2 of the present invention which realizes two-side display.

2. When the first transparent electrode layer 305 and the fourth transparent electrode layer 307 are located on the first substrate 301 and the third substrate 303 respectively, the corresponding structure diagram, the schematic diagram of realizing single-side display and the schematic diagram of realizing two-side display are as illustrated in FIGS. 8, 9 and 10 respectively.

The process of implementing single-side display and two-side display when the first transparent electrode layer 305 and the fourth transparent electrode layer 307 are located on the first substrate 301 and the third substrate 303 respectively is similar to the process of implementing single-side display, two-side display and completely-transparent display when the first transparent electrode layer 205 and the fourth transparent electrode layer 207 are located on the second substrate 202 and the fourth substrate 204 respectively, which will not be described any more here.

Embodiment 3

The present embodiment provides a display device including the above-mentioned display panel. Other components of the display device belong to traditional technologies and will not be described any more here.

Embodiment 4

The present embodiment further provides a manufacturing method of a display panel, including the following processes.

S31: Forming a display layer for two-side display on one side of a first substrate.

An example of forming a display layer for two-side display is: forming an anode on the first substrate; forming a pixel defining layer for separating pixel areas; and forming a hole transport layer, a light emitting layer, an electron transport layer and a cathode in turn in the pixel areas separated by the pixel defining layer. The resultant display elements are OLEDs.

S32: Forming a first electrophoresis layer between the other side of the first substrate and the second substrate, which includes a plurality of electrophoresis units with a transparent state and a black state and comprising microcapsules provided therein.

In one example, the first electrophoresis layer includes a first transparent electrode layer and a second transparent electrode layer; and the first transparent electrode layer and the second transparent electrode layer are disposed on the first substrate and the second substrate respectively. In another example, the first electrophoresis layer includes a first transparent electrode layer, a second transparent electrode layer and a third transparent electrode layer; and the first transparent electrode layer is disposed on the first substrate or the second substrate; the second transparent electrode layer and the third transparent electrode layer are disposed on two sides of the electrophoresis units respectively, the second transparent electrode layer and the third transparent electrode layer are perpendicular to the first substrate and second substrate respectively.

S33: Disposing a third substrate on the display layer.

S34: Forming a second electrophoresis layer between one side of the third substrate that is apart from the display layer and the fourth substrate, which includes a plurality of electrophoresis units with a transparent state and a black state.

Corresponding to step S32, in one example, the second electrophoresis layer includes a third transparent electrode layer and a fourth transparent electrode layer; and the third transparent electrode layer and the fourth transparent electrode layer are disposed on the third substrate and the fourth substrate respectively. In another example, the second electrophoresis layer includes a fourth transparent electrode layer, a fifth transparent electrode layer and a sixth transparent electrode layer; and the fourth transparent electrode layer is disposed on the third substrate or the fourth substrate; the fifth transparent electrode layer and the sixth transparent electrode layer are disposed on two sides of the electrophoresis units respectively, the fifth transparent electrode layer and the sixth transparent electrode layer are perpendicular to the third substrate and the fourth substrate respectively.

The electrophoresis units may also be injected with liquid containing black particles to achieve the same effect as micro-capsules. The liquid containing black particles is disposed between the first substrate and the second substrate or between the third substrate and the fourth substrate.

A method according to one example of the present embodiment will be described below with reference to FIG. 1.

S311: Forming a display layer capable of two-side display on one side of a first substrate.

An anode 112 is formed on the first substrate 101; a pixel defining layer 111 is formed for separating pixel areas; a hole transport layer 113, a light emitting layer 114, an electron transport layer 115 and a cathode 116 are formed in turn in the pixel areas separated by the pixel defining layer 111.

S312: Forming a first transparent electrode layer 102 on the other side of the first substrate 101.

S313: Forming a second transparent electrode layer 104 on a second substrate 103.

S314: Arranging the first substrate 101 and the second substrate 103 oppositely, providing a first electrophoresis layer between the first transparent electrode layer 102 and the second transparent electrode layer 104, in which the states of a plurality of electrophoresis units of the first electrophoresis layer includes a transparent state and a black state.

S315: Disposing a third substrate on the display layer.

S316: Forming a third transparent electrode layer 106 on one side of the third substrate 105 apart from the display layer.

S317: Forming a fourth transparent electrode layer 108 on the fourth substrate 107;

S318: Arranging the third substrate 105 and the fourth substrate 107 oppositely, wherein a second electrophoresis layer is provided between the third transparent electrode layer 106 and the fourth transparent electrode layer 108, and the states of a plurality of electrophoresis units of the second electrophoresis layer includes a transparent state and a black state.

Accordingly, a manufacturing method of display panels according to another example will be described below with reference to FIG. 5.

S321: Forming a display layer capable of two-side display on one side of a first substrate.

An anode 212 is formed on the first substrate 201; a pixel defining layer 211 is formed for separating pixel areas; a hole transport layer 213, a light emitting layer 214, an electron transport layer 215 and a cathode 216 are formed in turn in the pixel areas separated by the pixel defining layer 211.

S322: Forming a first transparent electrode layer 205 on a second substrate 202.

S323: Arranging the first substrate 201 and the second substrate 202 oppositely, wherein a first electrophoresis layer is provided between the first substrate 201 and the second substrate 202, and the states of a plurality of electrophoresis units of the first electrophoresis layer includes a transparent state and a black state; forming a second transparent electrode layer 2061 and a third transparent electrode layer 2062 on two sides of the electrophoresis units respectively, in which the second transparent electrode layer 2061 and the third transparent electrode layer 2062 are perpendicular to the first substrate 201 and the second substrate 202 respectively.

S324: Disposing a third substrate 303 on the display layer.

S325: Forming a fourth transparent electrode layer 307 on the fourth substrate 304.

S326: Arranging the third substrate 303 and the fourth substrate 304 oppositely, wherein a second electrophoresis layer is provided between the third substrate 303 and the fourth substrate 304, and the states of a plurality of electrophoresis units of the second electrophoresis layer includes transparent state and black state; forming a fifth transparent electrode layer 2081 and a sixth transparent electrode layer 2082 on two sides of the electrophoresis units, wherein the fifth transparent electrode layer 2081 and the sixth transparent electrode layer 2082 are perpendicular to the third substrate 303 and the fourth substrate 304 respectively.

Embodiment 5

The present embodiment further provides a display method for display panels, which is for example applicable to the display panel illustrated in FIGS. 1, 5 and 8. The method will be described below.

States of electrophoresis units of the electrophoresis layer are controlled to implement single-side display or two-side display in which the states of the electrophoresis units include a transparent state and a black state.

One example of controlling states of electrophoresis units of the electrophoresis layer to implement single-side display includes the following states:

S41: Allowing all the electrophoresis units in one electrophoresis layer into the transparent state.

A voltage is applied to the transparent electrode layer corresponding to all the electrophoresis units of one electrophoresis layer to drive the black particles in the micro-capsules to approach the corresponding transparent electrode layer and the black particles are out of the way of light emitted from the light emitting layer. Now the electrophoresis units exhibit the transparent state, and a display effect of the display panel can be seen from one corresponding side of the display panel.

With reference to the display panel illustrated in FIG. 1, with respect to an example in which the display panel is made to implement upper-side display, corresponding operation is to connect the second transparent electrode layer 104 and the fourth transparent electrode layer 108 to a reference voltage. A voltage is applied to a third transparent electrode layer 106 corresponding to all the electrophoresis units in the upper electrophoresis layer to the drive black particles 1102 in the micro-capsules 1092 to approach the corresponding third transparent electrode layer 106, and the black particles 1102 are out of the way of light emitted from the light emitting layer 114. Now the electrophoresis unit exhibit the transparent state, and the display effect of the display panel may be seen from the corresponding upper side of the display panel.

S42: Allowing all the electrophoresis units in the other electrophoresis layer into the black state.

A voltage is applied to the transparent electrode layer corresponding to all the electrophoresis units of the other electrophoresis layer to drive the black particles in the micro-capsules to move away from the corresponding transparent electrode layer and the black particles block light emitted from the light emitting layer. Now the electrophoresis units exhibit the black state, and a display effect of the display panel can not be seen from one corresponding side of the display panel.

With reference to the display panel illustrated in FIG. 1, the corresponding operations are: applying a voltage to a first transparent electrode layer 102 corresponding to all the electrophoresis units in the bottom electrophoresis layer to drive black particles 1101 in the micro-capsules 1091 to move away from the corresponding first transparent electrode layer 102, and the black particles 1101 block light emitted from the light emitting layer 114. Now the electrophoresis units exhibit the black state, and the display effect of the display panel can not be seen from the corresponding bottom side of the display panel.

FIG. 2 is a schematic diagram of a display panel provided in embodiment 1 of the present invention which realizes single-side display.

One example of controlling states of electrophoresis units of the electrophoresis layer to implement two-side display includes the following steps:

S51: Allowing odd numbered rows of electrophoresis units of one electrophoresis layer into the transparent state and even numbered rows of electrophoresis units into the black state.

A voltage is applied to a transparent electrode layer corresponding to odd numbered rows of (e.g., in a direction of from left to right) electrophoresis units in one electrophoresis layer to drive the black particles in the micro-capsules to approach the corresponding transparent electrode layer and the black particles are out of the way of light emitted from the light emitting layer. Now the electrophoresis units of odd numbered rows exhibit the transparent state. And a voltage is applied to a transparent electrode layer corresponding to even numbered rows of (e.g., in a direction of from left to right) electrophoresis units in the electrophoresis layer to drive the black particles in the micro-capsules to move away from the corresponding transparent electrode layer and the black particles block light emitted from the light emitting layer. Now the electrophoresis units of even numbered rows exhibit the black state.

With reference to the display panel illustrated in FIG. 1, with respect to an example in which the display panel is made to implement upper-side display, corresponding operation is to connect the second transparent electrode layer 104 and the fourth transparent electrode layer 108 to a reference voltage. A voltage is applied to a third transparent electrode layer 106 corresponding to odd numbered rows of (e.g., in a direction of from left to right) electrophoresis units in the upper electrophoresis layer to drive the black particles 1102 in the micro-capsules 1092 to approach the corresponding third transparent electrode layer 106 and the black particles 1102 are out of the way of light emitted from the light emitting layer 114. Now the electrophoresis units of odd numbered rows exhibit the transparent state. And a voltage is applied to the first transparent electrode layer 106 corresponding to even numbered rows of (e.g., in a direction of from left to right) electrophoresis units in the upper electrophoresis layer to drive black particles 1102 in the micro-capsules 1092 to move away from the corresponding third transparent electrode layer 106 and the black particles 1102 block light emitted from the light emitting layer 114. Now the electrophoresis units of even numbered rows exhibit the black state.

S52: Allowing odd numbered rows of electrophoresis units of the other electrophoresis layer into the black state and even numbered rows of electrophoresis units into the transparent state;

A voltage is applied to a transparent electrode layer corresponding to odd numbered rows of (e.g., in a direction of from left to right) electrophoresis units in the other electrophoresis layer to drive the black particles in the micro-capsules to move away from the corresponding transparent electrode layer and the black particles block light emitted from the light emitting layer. Now the electrophoresis units of odd numbered rows exhibit the black state. And a voltage is applied to a transparent electrode layer corresponding to even numbered rows of (e.g., in a direction of from left to right) electrophoresis units in the electrophoresis layer to drive the black particles in the micro-capsules to approach the corresponding transparent electrode layer and the black particles are out of the way of light emitted from the light emitting layer. Now the electrophoresis units of even numbered rows exhibit the transparent state.

With reference to the display panel illustrated in FIG. 1, with respect to an example in which the display panel implements bottom display, the corresponding operations are: applying a voltage to a first transparent electrode layer 102 corresponding to odd numbered rows of (e.g., in a direction of from left to right) electrophoresis units in the bottom electrophoresis layer to drive black particles 1101 in the micro-capsules 1091 to move away from the corresponding first transparent electrode layer 102 and the black particles 1101 block light emitted from the light emitting layer 114. Now the electrophoresis units of odd numbered rows exhibit the black state. And a voltage is applied to the first transparent electrode layer 102 corresponding to even numbered rows of (e.g., in a direction of from left to right) electrophoresis units in the electrophoresis layer to drive black particles 1101 in the micro-capsules 1091 to approach the corresponding first transparent electrode layer 102 and the black particles 1101 are out of the way of light emitted from the light emitting layer 114. Now the electrophoresis units of even numbered rows exhibit the transparent state.

S53: Display dependent on regions of the display layer, wherein odd numbered rows of pixel units of the display layer display one picture, while even numbered rows of pixel units of the display layer display another picture.

Pixel units in the display layer corresponding to the transparent state of electrophoresis units in step S51 display one picture, and pixel units in the display layer corresponding to the transparent state of electrophoresis units in step S52 display another picture. The two pictures of the display layer may display the same image or different images respectively.

FIG. 3 is a schematic diagram of a display panel provided in embodiment 1 of the present invention which realizes two-side display;

For the display panel illustrated in FIGS. 5 and 8, the operating method is similar to the above-mentioned one, and will not be described any more here.

Micro-capsules in electrophoresis units of electrophoresis layers according to embodiments of the present invention can contain only black particles (typically micro-capsules contain black particles and white particles) to control the states of electrophoresis units (including transparent state and black state) by changing the positions of black particles in the micro-capsules, and in turn realize two-side display of the display panel, which saves material expenses, and mitigates process requirements at the same time, thereby is easy to implement.

The electrophoresis layer according to embodiments of the present invention has a simple structure and a small thickness, the display layer has a small thickness due to the application of organic electroluminescent diodes and has two display surfaces at the same time, which allows the thickness of the entire display panel to be reduced; and single-side display or two-side display, even completely-transparent display of the display panel may be implemented by cooperation of the display layer and the electrophoresis layer.

All the substrates used in embodiments of the present invention may be rigid substrates or flexible substrates, which further extends the application fields of the present invention.

The above implementations are only for the purpose of explaining the present invention rather than limiting the present invention. One of ordinary skill in the art can further make various modifications and variations without departing from the spirit and scope of the present invention. Therefore all equivalents fall within the scope of the present invention and the scope of patent protection for the present invention should be defined by claims.

The invention claimed is:

1. A manufacturing method of display panels, comprising:
    forming a display layer for a two-side display on one side of a first substrate, the display layer comprising an array of pixel units;
    forming a first electrophoresis layer between an other side of the first substrate and a second substrate, the first electrophoresis layer comprising a plurality of electrophoresis units with a transparent state and a non-transparent state;
    disposing a third substrate on the display layer; and
    forming a second electrophoresis layer between one side of the third substrate, opposite of the display layer, and a fourth substrate, the second electrophoresis layer comprising a plurality of electrophoresis units with the transparent state and the non-transparent state,
    wherein each pixel unit includes a respective organic light emitting diode located between the first electrophoresis layer and the second electrophoresis layer,
    wherein the first electrophoresis layer includes a first transparent electrode layer; a second transparent electrode layer and a third transparent electrode layer; and the first transparent electrode layer is disposed on the first substrate or the second substrate; the second transparent electrode layer and the third transparent electrode layer are disposed on two sides of the electrophoresis units respectively, the second transparent electrode layer and the third transparent electrode layer are perpendicular to the first substrate and second substrate respectively,
    wherein the second electrophoresis layer comprises a fourth transparent electrode layer, a fifth transparent electrode layer and a sixth transparent electrode layer; and the fourth transparent electrode layer is disposed on the third substrate or the fourth substrate; the fifth transparent electrode layer and the sixth transparent electrode layer are disposed on two sides of the electrophoresis units respectively, the fifth transparent electrode layer and the sixth transparent electrode layer are perpendicular to the third substrate and fourth substrate respectively.

2. The manufacturing method of claim 1, wherein micro-capsules are provided in the electrophoresis units and the micro-capsules comprise liquid and black charged particles.

3. The manufacturing method of claim 1, wherein liquid containing black particles is injected into the electrophoresis units, and the liquid containing black particles is disposed between the first substrate and the second substrate or between the third substrate and the fourth substrate.

4. The manufacturing method of claim 1, wherein forming of the display layer for two-side display comprises:
    forming an anode on the first substrate;
    forming a pixel defining layer for separating pixel areas; and
    forming a hole transport layer, a light emitting layer, an electron transport layer and a cathode in the pixel areas separated by the pixel defining layer.

5. The manufacturing method of claim 1, wherein the array of pixel units are in one-to-one correspondence to electrophoresis units of each of the two electrophoresis layers.

6. The manufacturing method of claim 1, wherein the transparent electrode layers are plane electrode layers or patterned electrode layers.

7. The manufacturing method of claim 1, wherein the organic light emitting diode comprises an anode, an organic layer and a cathode formed on a base substrate; and the organic layer is between the anode and the cathode and the organic layer comprises a light emitting layer.

8. A display panel comprising:
    a display layer for a two-side display on one side of a first substrate, the display layer comprising an array of pixel units;
    first electrophoresis layer between an other side of the first substrate and a second substrate, the first electrophoresis layer comprising a plurality of electrophoresis units with a transparent state and a non-transparent state;
    a third substrate disposed on the display layer; and
    a second electrophoresis layer between one side of the third substrate, opposite of the display layer, and a fourth substrate, the second electrophoresis layer comprising a plurality of electrophoresis units with the transparent state and the non-transparent state,
    wherein each pixel unit includes a respective organic light emitting diode located between the first electrophoresis layer and the second electrophoresis layer,
    wherein the first electrophoresis layer includes a first transparent electrode layer, a second transparent electrode layer and a third transparent electrode layer; and the first transparent electrode layer is disposed on the first substrate or the second substrate; the second transparent electrode layer and the third transparent electrode layer are disposed on two sides of the electrophoresis units respectively, the second transparent electrode layer and the third transparent electrode layer are perpendicular to the first substrate and second substrate respectively,
    wherein the second electrophoresis layer comprises a fourth transparent electrode layer, a fifth transparent electrode layer and a sixth transparent electrode layer; and the fourth transparent electrode layer is disposed on the third substrate or the fourth substrate; the fifth transparent electrode layer and the sixth transparent electrode layer are disposed on two sides of the electrophoresis units respectively, the fifth transparent electrode layer and the sixth transparent electrode layer are perpendicular to the third substrate and fourth substrate respectively.

9. A display method for a display panel applying the display panel of claim 8, the method comprising:
    controlling states of electrophoresis units in an electrophoresis layer to implement single-side display or two-side display;
    controlling odd numbered rows of electrophoresis units of one electrophoresis layer to be in a transparent state and even numbered rows of electrophoresis units to be in a non-transparent state;
    controlling odd numbered rows of electrophoresis units of another electrophoresis layer to be in the non-transparent state and even numbered rows of electrophoresis units to be in the transparent state; and displaying dependent on a region of a display layer, in which odd numbered rows of pixel units of the display layer display one picture, while even numbered rows of pixel units of the display layer display another picture.

10. The method of claim 9, wherein controlling states of electrophoresis units of the electrophoresis layer to implement single-side display comprises:

controlling all the electrophoresis units in one electrophoresis layer to be in the transparent state; and controlling all the electrophoresis units in an other electrophoresis layer to be in the non-transparent state.

11. The display panel of claim 8, wherein micro-capsules are provided in the electrophoresis units and the micro-capsules comprise liquid and black charged particles.

12. The display panel of claim 8, wherein liquid containing black particles is in the electrophoresis units, and the liquid containing black particles is between the first substrate and the second substrate or between the third substrate and the fourth substrate.

13. The display panel of claim 8, wherein the display layer for the two-side display comprises:

an anode on the first substrate;

a pixel defining layer for separating pixel areas; and a hole transport layer, a light emitting layer, an electron transport layer and a cathode in the pixel areas separated by the pixel defining layer.

14. The display panel of claim 8, wherein the array of pixel units are in one-to-one correspondence to electrophoresis units of each of the two electrophoresis layers.

15. The display panel of claim 8, wherein the transparent electrode layers are plane electrode layers or patterned electrode layers.

16. The display panel of claim 8, wherein the organic light emitting diode comprises an anode, an organic layer and a cathode formed on a base substrate; and the organic layer is between the anode and the cathode and the organic layer comprises a light emitting layer.

* * * * *